(12) United States Patent
Kwak et al.

(10) Patent No.: US 8,013,432 B2
(45) Date of Patent: Sep. 6, 2011

(54) PACKAGE SUBSTRATE, SEMICONDUCTOR PACKAGE HAVING THE PACKAGE SUBSTRATE

(75) Inventors: Yong-Il Kwak, Asan-si (KR); Jun-Hyuk Choi, Cheonan-si (KR); Jeong-Sam Lee, Cheonan-si (KR); Jong-Kak Jang, Asan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 91 days.

(21) Appl. No.: 12/558,138

(22) Filed: Sep. 11, 2009

(65) Prior Publication Data
US 2010/0065957 A1    Mar. 18, 2010

(30) Foreign Application Priority Data
Sep. 18, 2008   (KR) .................. 10-2008-0091490

(51) Int. Cl.
*H01L 23/52* (2006.01)
(52) U.S. Cl. ...................... 257/690; 257/737
(58) Field of Classification Search .............. 257/778, 257/737, 690
See application file for complete search history.

(56) References Cited

U.S. PATENT DOCUMENTS
6,175,159 B1 * 1/2001 Sasaki .................. 257/778
2003/0235636 A1 12/2003 Tsai et al.

FOREIGN PATENT DOCUMENTS
KR  1020000044991 A  7/2000
KR  1020020053657 A  7/2002
KR  1020020066745 A  8/2002

* cited by examiner

*Primary Examiner* — Roy K Potter
(74) *Attorney, Agent, or Firm* — F. Chau & Associates, LLC

(57) ABSTRACT

A package substrate includes an insulating substrate having a mount region including external terminals mounted to the insulating substrate and a clamp region having an opening receiving a molding material therein, the clamp region disposed adjacent to the mount region in a first direction, a circuit pattern formed on the insulating substrate, and a blocking member blocking the molding material from moving from the clamp region to the mount region when the package substrate loaded in a mold die is pressurized to form a molding member, wherein the blocking member is disposed on at least one side of the package substrate in the clamp region, and the blocking member receives the molding material therein.

18 Claims, 8 Drawing Sheets

PACKAGE SUBSTRATE, SEMICONDUCTOR PACKAGE HAVING THE PACKAGE SUBSTRATE

CROSS-REFERENCE TO RELATED APPLICATION

This application claims priority under 35 USC §119 to Korean Patent Application No. 2008-91490, filed on Sep. 18, 2008, the contents of which are herein incorporated by reference in their entirety.

BACKGROUND

1. Technical Field

The present disclosure relates to a semiconductor package having a package substrate, and more particularly to a semiconductor package having a package substrate including a blocking member.

2. Discussion of the Related Art

Various semiconductor fabrication processes may be performed on a semiconductor substrate to form a plurality of semiconductor chips. The semiconductor chips can be mounted on a printed circuit board (PCB) in the form of a semiconductor package.

The semiconductor package may include a semiconductor chip, a package substrate, conductive wires, a molding member and external terminals. The semiconductor chip may be mounted on the package substrate. The conductive wires may electrically connect the semiconductor chip with the package substrate. The molding member may be disposed on the package substrate and the semiconductor chip and may cover the conductive wires. The external terminals may be mounted on the package substrate.

The molding member may be formed using a mold die that may have a cavity receiving the semiconductor chip and the package substrate. A molding material may be introduced into the cavity to form the molding member.

In the molding process, the molding material needs to be prevented from moving into regions of the package substrate where the external terminals are mounted. The molding member needs to be formed without voids therein.

SUMMARY OF THE INVENTIVE CONCEPT

Exemplary embodiments provide a package substrate preventing a molding material from infiltrating into regions of the package substrate where external terminals are mounted. A molding member according to an exemplary embodiment of the present inventive concept can be formed without voids therein.

According to an exemplary embodiment, a package substrate comprises an insulating substrate having a mount region including external terminals mounted to the insulating substrate and a clamp region having an opening receiving a molding material therein, the clamp region disposed adjacent to the mount region in a first direction, a circuit pattern formed on the insulating substrate, and a blocking member blocking the molding material from moving from the clamp region to the mount region when the package substrate loaded in a mold die is pressurized to form a molding member, wherein the blocking member is disposed on at least one side of the package substrate in the clamp region, and the blocking member receives the molding material therein.

The clamp region can be located at a central portion of the insulating substrate.

The molding material may pass through the opening.

The blocking member can comprise at least one receiving groove extended in a second direction substantially perpendicular to the first direction.

The blocking member may comprise a mesh pattern having a plurality of receiving grooves.

The blocking member can be disposed on the insulating substrate.

The blocking member can be disposed on portions of the circuit pattern corresponding to the clamp region of the insulating substrate.

The package substrate may further comprise an insulating layer pattern formed on the insulating substrate.

The insulating layer pattern can partially expose the circuit pattern.

The blocking member can be disposed on the insulating layer pattern.

According to an exemplary embodiment, a semiconductor package substrate comprises a package substrate including an insulating substrate comprising a mount region and a clamp region, a circuit pattern formed on the insulating substrate, and a blocking member disposed on at least one side of the package substrate in the clamp region, a semiconductor chip having pads placed on the package substrate, conductive connecting members for electrically connecting the circuit pattern to the pads of the semiconductor chip, a molding member disposed on the semiconductor chip and the package substrate and covering the conductive connecting members, and external terminals mounted on the circuit pattern in the mount region, wherein the blocking member blocks a material used to form the molding member from moving from the clamp region to the mount region when the package substrate loaded in a mold die is pressurized to form the molding member, wherein the blocking member receives the molding material therein.

The pads can be arranged on a central portion of the semiconductor chip.

The package substrate can have an opening formed in the clamp region to expose the pads.

The conductive connecting members may comprise conductive wires.

According to an exemplary embodiment, a method of forming a semiconductor package substrate comprises forming a package substrate that includes an insulating substrate having a mount region and a clamp region, a circuit pattern formed on the insulating substrate, and a blocking member disposed on at least one side of the package substrate in the clamp region, placing a semiconductor chip having pads on the package substrate, electrically connecting the circuit pattern to the pads of the semiconductor chip, positioning the package substrate and the semiconductor chip in a cavity of a mold die, introducing a molding material into the cavity, pressurizing the mold die having the molding material to form a molding member on the semiconductor chip and the package substrate, and mounting external terminals on the circuit pattern in the mount region.

Placing the semiconductor chip on the package substrate may comprise exposing pads through an opening that is formed through a central portion of the package substrate.

The circuit pattern can be electrically connected to the pads using conductive wires.

Pressurizing the mold die having the molding material to form a molding member on the semiconductor chip and the package substrate may comprise covering the conductive wires with the molding member.

BRIEF DESCRIPTION OF THE DRAWINGS

Exemplary embodiments of the present inventive concept can be understood in more detail from the following descriptions taken in conjunction with the accompanying drawings, in which.

DETAILED DESCRIPTION OF EXEMPLARY EMBODIMENTS

The present invention is described more fully hereinafter with reference to the accompanying drawings, in which exemplary embodiments of the present invention are shown. The present invention may, however, be embodied in many different forms and should not be construed as limited to the exemplary embodiments set forth herein. It will be understood that when an element or layer is referred to as being "on," "connected to" or "coupled to" another element or layer, it can be directly on, connected or coupled to the other element or layer or intervening elements or layers may be present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
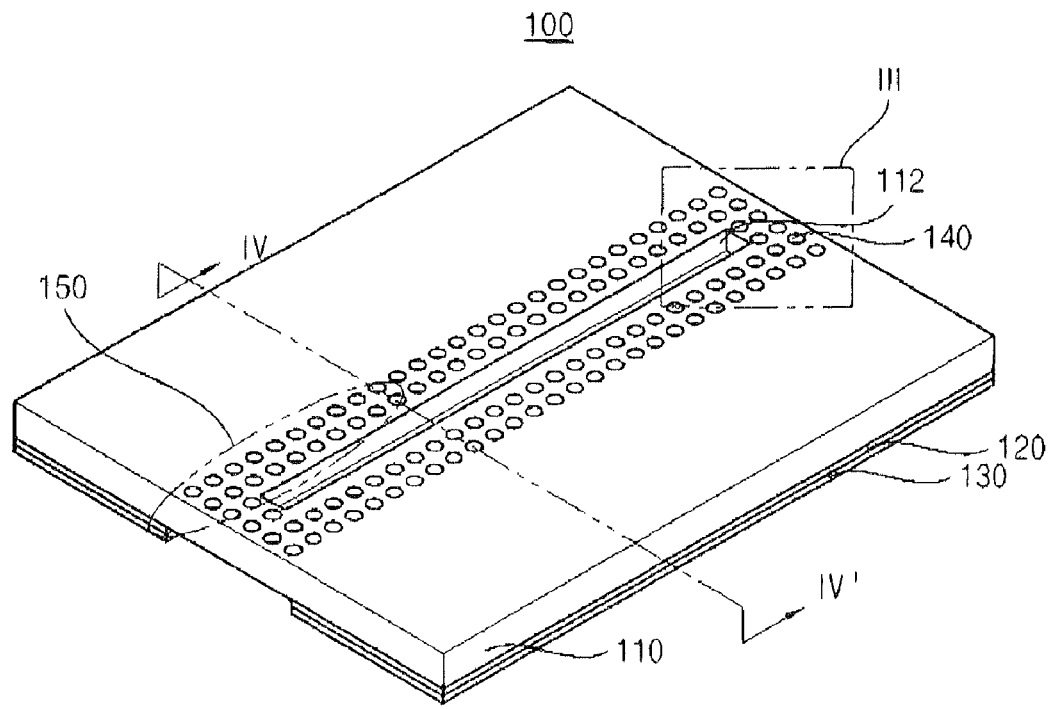
FIG. 1 is a perspective view illustrating a package substrate in accordance with an exemplary embodiment of the present invention.
Figure 2:
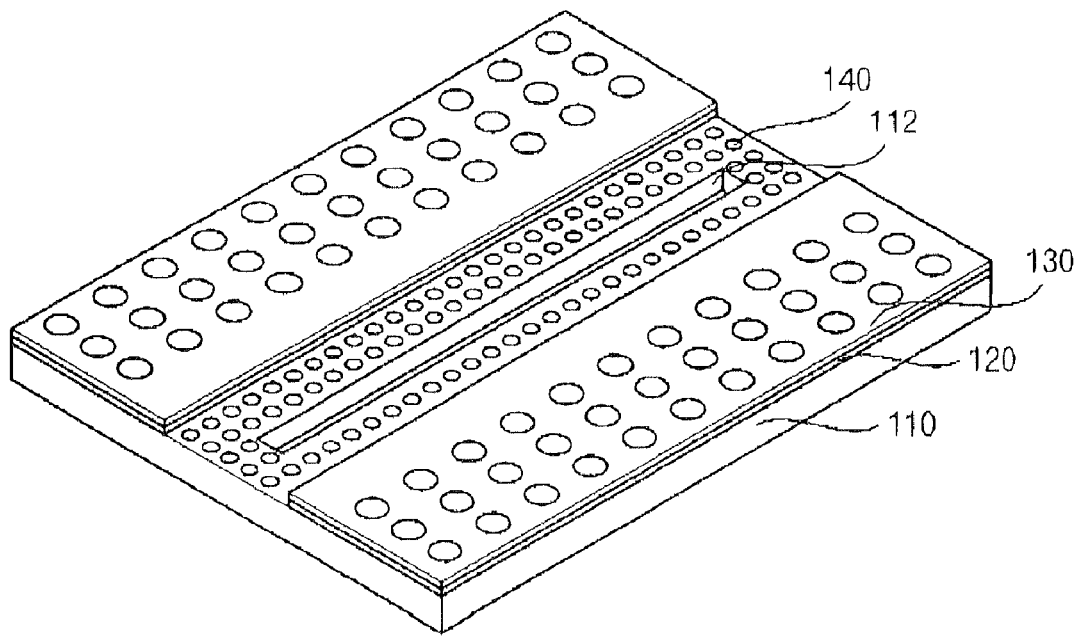
FIG. 2 is a perspective view illustrating a bottom structure of a package substrate according to an exemplary embodiment of the present invention.
Figure 3:
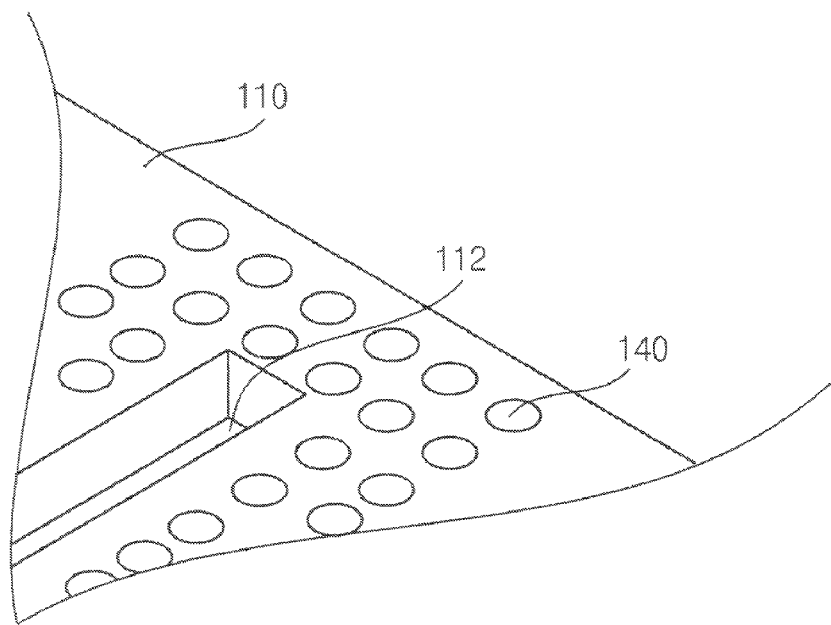
FIG. 3 is an enlarged perspective view illustrating the portion "III" in FIG. 1 according to an exemplary embodiment of the present invention.
Figure 4:
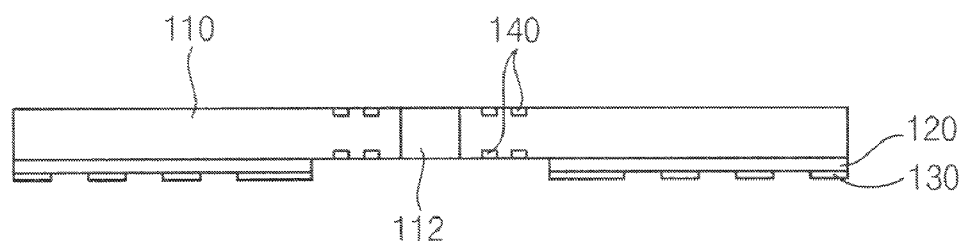
FIG. 4 is a cross-sectional view taken along the line IV-IV' in FIG. 1 according to an exemplary embodiment of the present invention.

FIG. 1 is a perspective view illustrating a package substrate in accordance with an exemplary embodiment of the present invention. FIG. 2 is a perspective view illustrating a bottom structure of a package substrate according to an exemplary embodiment of the present invention. FIG. 3 is an enlarged perspective view illustrating the portion "III" in FIG. 1 according to an exemplary embodiment of the present invention. FIG. 4 is a cross-sectional view taken along the line IV-IV' in FIG. 1 according to an exemplary embodiment of the present invention.

Referring to FIGS. 1 to 4, a package substrate 100 may include an insulating substrate 110, a circuit pattern 120, an insulating layer pattern 130 and a blocking member 150.

The insulating substrate 110 may have a rectangular thin plate shape. In an exemplary embodiment the insulating substrate 110 may include an insulating polymer. The insulating substrate 110 may have a single opening 112. The opening 112 may be linearly formed through a central portion of the insulating substrate 110.

The insulating substrate 110 may have a mount region and a clamp region. The mount region may correspond to a region where external terminals of a semiconductor package are mounted. The clamp region may correspond to a region clamped with a mold die used for a molding process. In an exemplary embodiment, the clamp region may be located at the central portion of the insulating substrate 110. The mount region may be located at both edge portions of the insulating substrate 110.

In an exemplary embodiment, a semiconductor chip may be placed on an upper surface of the insulating substrate 110. When manufacturing the semiconductor package, conductive connecting members may pass through the opening 112. The conductive connecting members can be electrically connected to the semiconductor chip. The opening 112 may be filled with a molding member in the molding process.

The circuit pattern 120 may be disposed on the insulating substrate 110. In an exemplary embodiment the circuit pattern 120 may be disposed on a lower surface of the insulating substrate 110. The circuit pattern 120 may be disposed in only the mount region, not in the clamp region of the insulating substrate 110. The circuit pattern 120 may include a thin conductive foil such as, for example, a copper foil. The circuit pattern 120 may be disposed on an upper surface of the insulating substrate 110. That is, the circuit pattern 120 may be disposed on the upper surface, the lower surface or both of the upper surface and the lower surface of the insulating substrate 110 in accordance with types of the semiconductor chips.

The insulating layer pattern 130 may be formed on the lower surface of the insulating substrate 110. The insulating layer pattern 130 may have openings partially exposing the circuit pattern 120. Portions of the circuit pattern 120 exposed through the openings may correspond to ball lands on which the external terminals such as solder balls may be mounted. In an exemplary embodiment, the insulating layer pattern 130 may be formed in only the mount region, not in the clamp region of the insulating substrate 110. The insulating layer pattern 130 may include photosensitive resist.

The blocking member 150 may be provided in the clamp region of the insulating substrate 110. The blocking member 150 may contact the mold die to prevent a molding material from infiltrating into the mount region from the clamp region. That is, when the mold die directly contacts the insulating substrate 110, the blocking member 150 may be formed on the insulating substrate 110. In an exemplary embodiment, the blocking member 150 may include a mesh pattern formed on the insulating substrate 110. The mesh pattern may have a plurality of receiving grooves 140 configured to partially receive the molding member. The receiving grooves 140 may be arranged in lengthwise and widthwise directions with substantially the same interval between the grooves. That is, the mesh pattern may be formed on the insulating substrate 110 by forming the receiving grooves 140 in the clamp region at both sides of the opening 112 of the insulating substrate 110. The receiving grooves 140 may be formed by partially etching the insulating substrate 110.

In an exemplary embodiment, the receiving grooves 140 may reduce a contact area between the clamp region and the mold die. Thus, the mold die may apply more pressure to the clamp region of the insulating substrate 110 as compared when there is no blocking member. Because the mold die may clamp the insulating substrate 110 with more pressure, the molding member may not infiltrate into the mount region.

To prevent the generation of voids in the molding member, a sufficient amount of the molding member needs to be provided. Thus, the molding member may be drained between the mold die and the insulating substrate 110. When the drained molding member may infiltrate into the mount region, the ball lands of the circuit pattern 120 may be covered with the infiltrated molding member. However, according to an exemplary embodiment of the present invention, the drained molding member may be received in the receiving grooves 140, so that the molding member may not flow into the mount region.

According to an exemplary embodiment, a clamp pressure of the mold die with respect to the insulating substrate may be increased due to the receiving grooves of the blocking member. Thus, the molding member may not infiltrate into the mount region. The molding member may be partially received in the receiving grooves, so that a sufficient amount of the molding member may be used in the molding process. As a result, voids may not be generated in the molding member.

Figure 5:
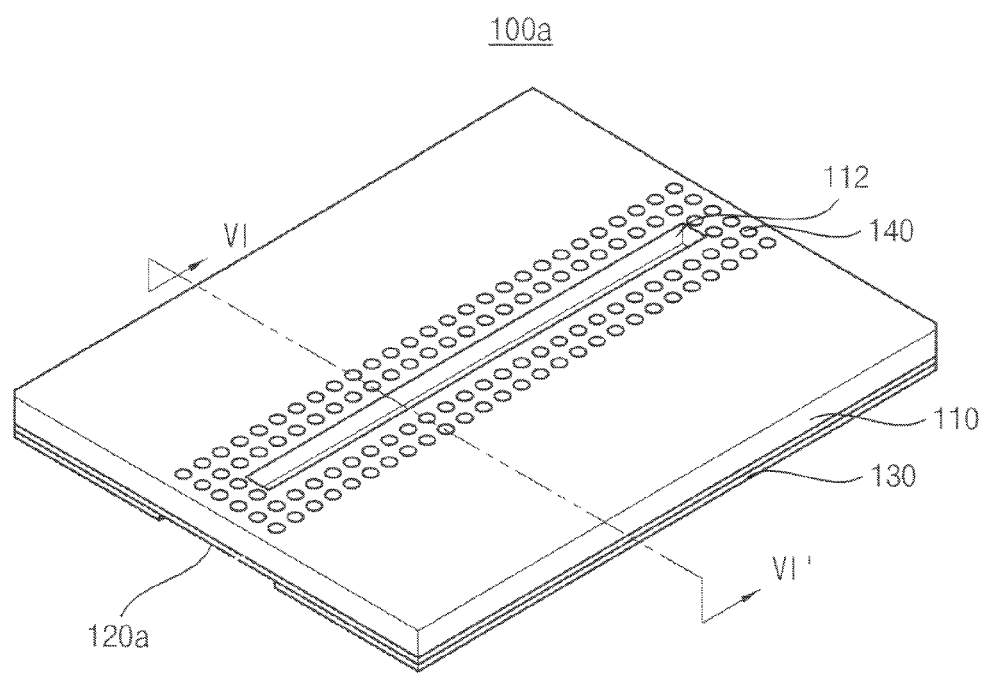
FIG. 5 is a perspective view illustrating a package substrate in accordance with an exemplary embodiment of the present invention.
Figure 6:
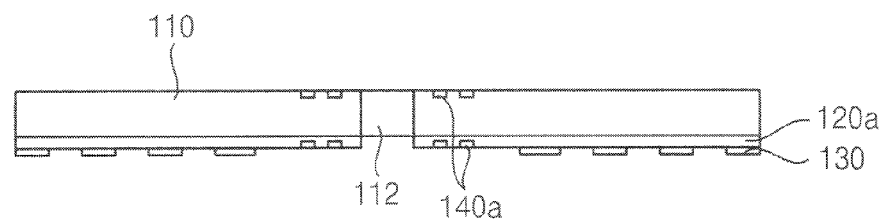
FIG. 6 is a cross-sectional view taken along the line VI-VI' in FIG. 5 according to an exemplary embodiment of the present invention.

FIG. 5 is a perspective view illustrating a package substrate in accordance with an exemplary embodiment of the present invention. FIG. 6 is a cross-sectional view taken along the line VI-VI' in FIG. 5 according to an exemplary embodiment of the present invention.

A package substrate 100a may include elements substantially the same as those of the package substrate 100 in FIG. 1 except for a blocking member.

Referring to FIGS. 5 and 6, the circuit pattern 120a may be formed on the clamp region and the mount region of the insulating substrate 110. The blocking member may be disposed in portions of the circuit pattern 120a corresponding to the clamp region. Thus, a plurality of receiving grooves 140a may be formed on the circuit pattern 120a. That is, when the mold die contacts the circuit pattern 120a, the blocking member may be formed on the circuit pattern 120a.

Figure 7:
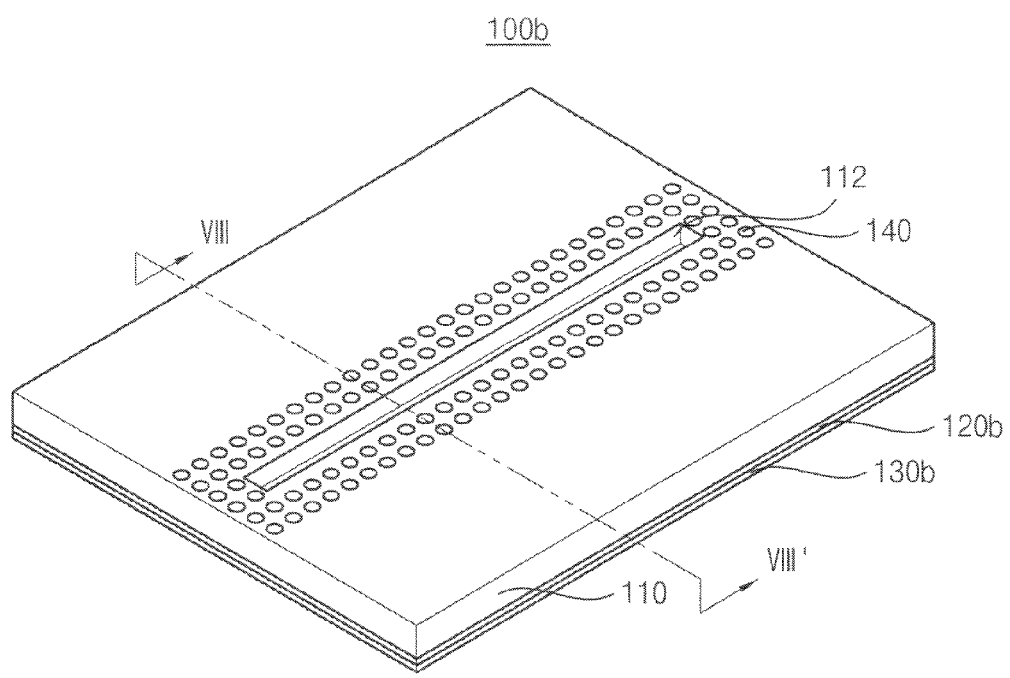
FIG. 7 is a perspective view illustrating a package substrate in accordance with an exemplary embodiment of the present invention.
Figure 8:
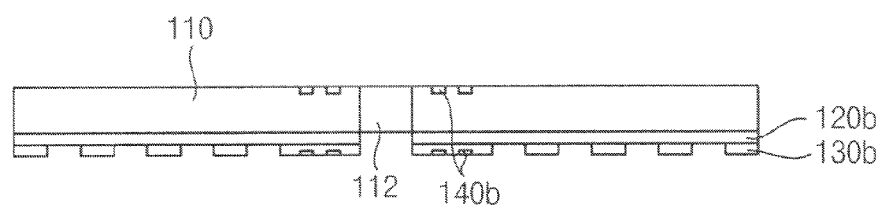
FIG. 8 is a cross-sectional view taken along the line VIII-VIII' in FIG. 7 according to an exemplary embodiment of the present invention.

FIG. 7 is a perspective view illustrating a package substrate in accordance with an exemplary embodiment of the present invention. FIG. 8 is a cross-sectional view taken along the line VIII-VIII' in FIG. 7 according to an exemplary embodiment of the present invention.

A package substrate 100b may include elements substantially the same as those of the package substrate 100 in FIG. 1 except for a blocking member.

Referring to FIGS. 7 and 8, the insulating layer pattern 130b may be formed on the clamp region and the mount region of the insulating substrate 110. The blocking member may be disposed in portions of the insulating layer pattern 130b corresponding to the clamp region. Thus, a plurality of receiving grooves 140b may be formed on the insulating layer pattern 130b. That is, when the mold die contacts the insulating layer pattern 130b, the blocking member may be formed on the insulating layer pattern 130b. In an exemplary embodiment, the circuit pattern 120b may be formed only on the mount region or both of the mount region and the clamp region of the insulating substrate 110.

Figure 9:
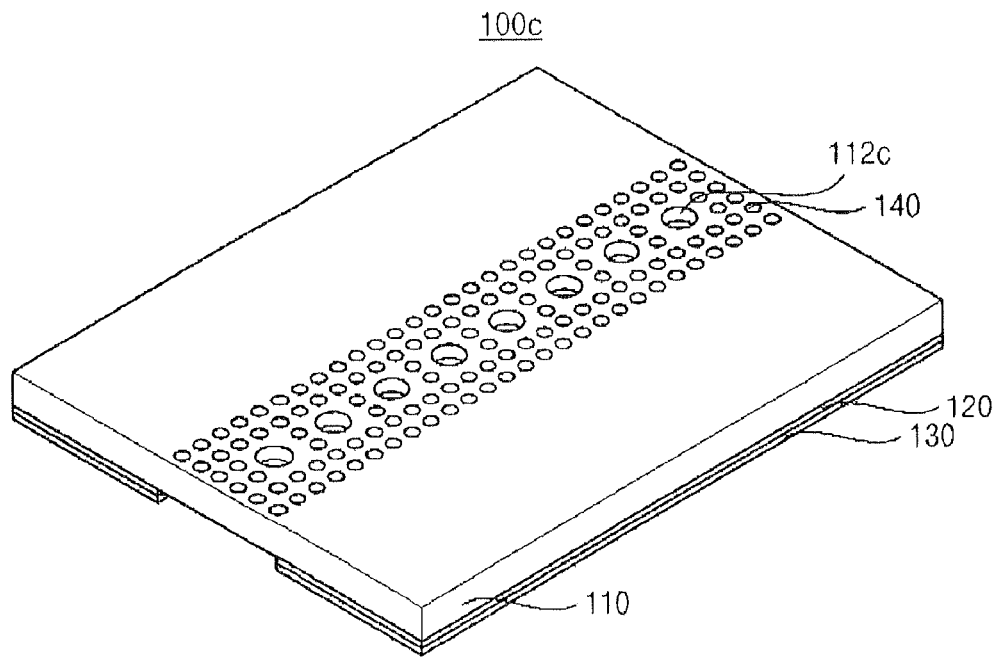
FIG. 9 is a perspective view illustrating a package substrate in accordance with an exemplary embodiment of the present invention.

FIG. 9 is a perspective view illustrating a package substrate in accordance with an exemplary embodiment of the present invention.

A package substrate 100c may include elements substantially the same as those of the package substrate 100 in FIG. 1 except for an insulating substrate.

Referring to FIG. 9, the insulating substrate 110c may have a plurality of openings 112c. The conductive connecting members may pass through the openings 112c. The openings 112c may be filled with the molding member.

Figure 10:
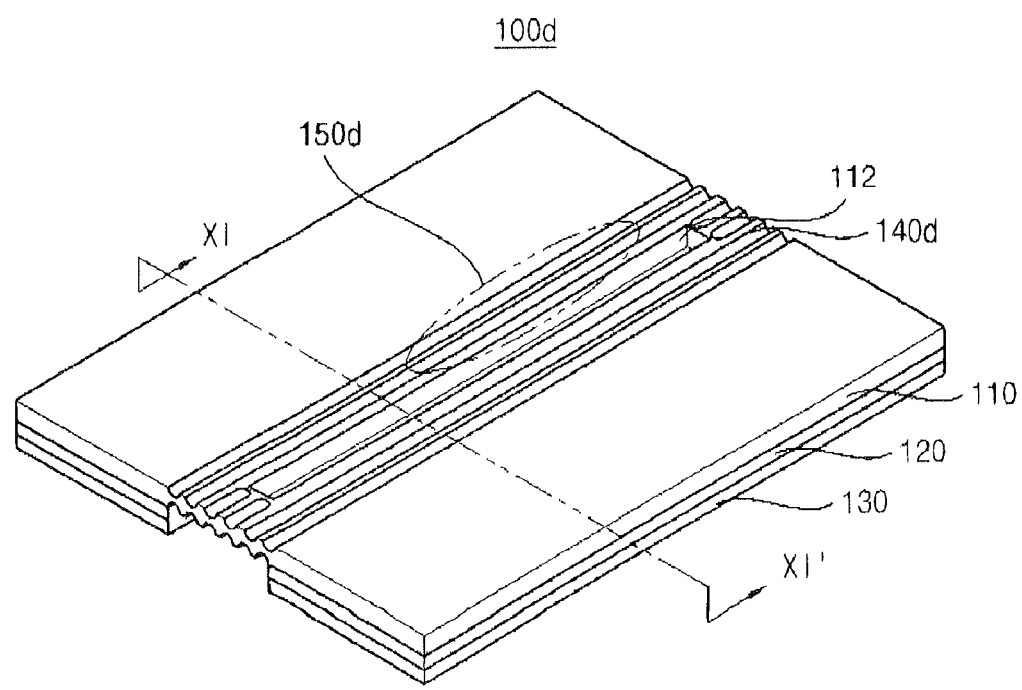
FIG. 10 is a perspective view illustrating a package substrate in accordance with an exemplary embodiment of the present invention.
Figure 11:
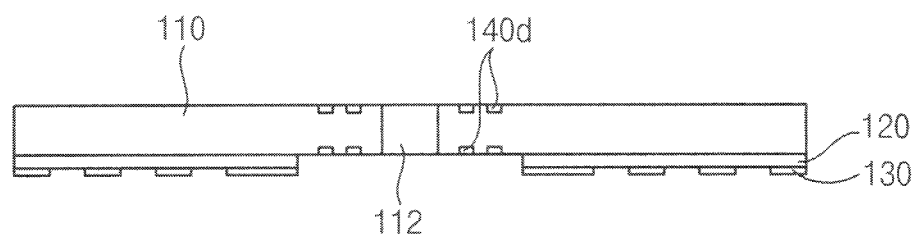
FIG. 11 is a cross-sectional view taken along the line XI-XI' in FIG. 10 according to an exemplary embodiment of the present invention.

FIG. 10 is a perspective view illustrating a package substrate in accordance with an exemplary embodiment of the present invention. FIG. 11 is a cross-sectional view taken along the line XI-XI' in FIG. 10 according to an exemplary embodiment of the present invention.

A package substrate 100d may include elements substantially the same as those of the package substrate 100 in FIG. 1 except for a blocking member.

Referring to FIGS. 10 and 11, the blocking member 150d may include at least one receiving groove 140d. The receiving groove 140d may extend in a direction substantially in parallel with a lengthwise direction of the opening 112. In an exemplary embodiment, each of the three receiving grooves 140d may be formed at both sides of the opening 112. The receiving grooves 140d may be formed on at least one of the insulating substrate 110, the circuit pattern 120 or the insulating layer pattern 130.

Figure 12:
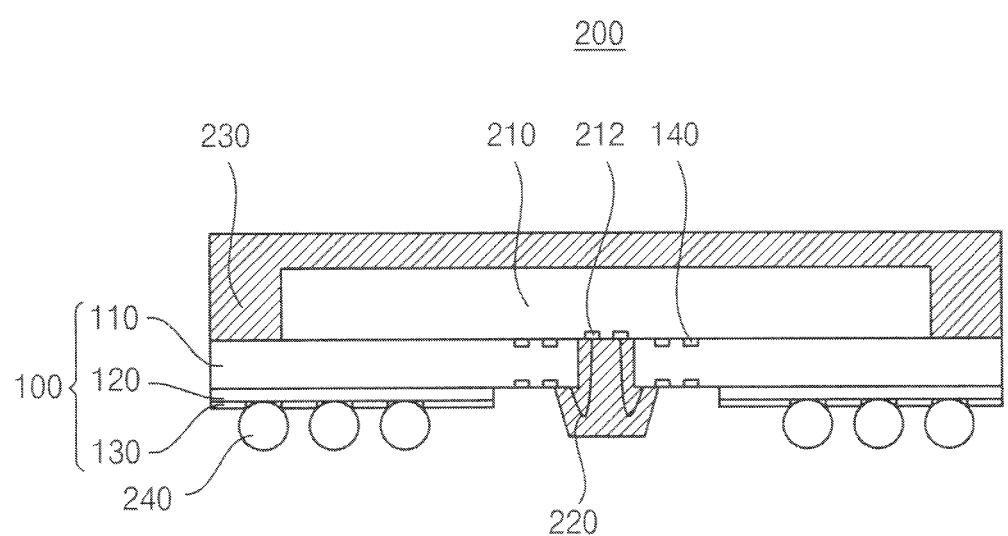
FIG. 12 is a cross-sectional view illustrating a semiconductor package according to an exemplary embodiment of the present invention.

FIG. 12 is a cross-sectional view illustrating a semiconductor package in an exemplary embodiment of the present invention.

Referring to FIG. 12, a semiconductor package 200 may include the package substrate 100, a semiconductor chip 210, conductive connecting members 220, a molding member 230 and external terminals 240.

The package substrate 100 may be substantially the same as the package substrate in FIG. 1. Alternatively, any one of the package substrates in FIGS. 5, 7, 9 and 10 may be employed in the semiconductor package 200 in place of the package substrate 100 in FIG. 1.

The semiconductor chip 210 may be placed on an upper surface of the package substrate 100. The semiconductor chip 210 may have a plurality of pads 212. In an exemplary embodiment, the pads 212 may be arranged on a central portion of a lower surface of the semiconductor chip 210. Thus, the pads 212 may be exposed through the opening 112 of the insulating substrate 110.

The conductive connecting members 220 may electrically connect the pads 212 with the circuit pattern 120. Thus, the each of the conductive connecting members 220 may have a first end connected to the pad 212, and a second end connected to the circuit pattern 120 through the opening 112. The conductive connecting members 220 may include conductive wires such as, for example, gold.

The molding member 230 may be formed over the package substrate 100 to cover the semiconductor chip 210. The opening 112 may be filled with the molding member 230 to cover the conductive connecting members 220 with the molding member 230. Thus, a lower surface of the molding member 230 in the opening 112 may be slightly protruded from the lower surface of the package substrate 100. In an exemplary embodiment, the molding member 230 may include epoxy molding compound (EMC). Alternatively, the molding member 230 may include a liquefied material.

The molding member 230 in the opening 112 may not be moved toward the mount region by the blocking member. Thus, the molding member 230 may be positioned only in the clamp region, not the mount region.

The external terminals 240 may be mounted on the ball lands of the circuit pattern 120. That is, the external terminals 240 may be mounted on the ball lands of the circuit pattern 120 exposed through the openings of the insulating layer pattern 130. In an exemplary embodiment the external terminals 240 may include solder balls.

FIGS. 13 to 17 are cross-sectional views illustrating a method of manufacturing a semiconductor package according to an exemplary embodiment of the present invention.

Figure 13:
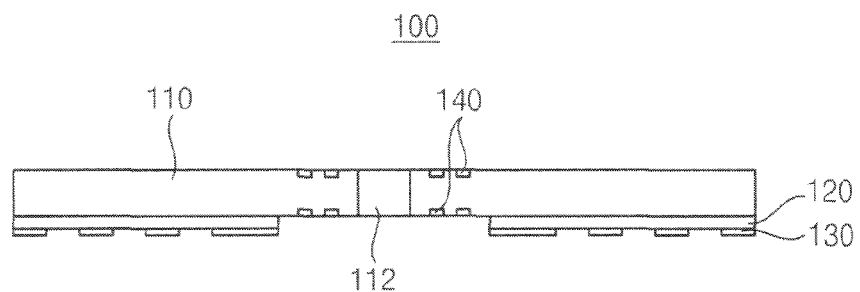
FIGS. 13 to 17 are cross-sectional views illustrating a method of manufacturing a semiconductor package according to an exemplary embodiment of the present invention.

Referring to FIG. 13, the package substrate 100 may be prepared. The package substrate 100 may be substantially the same as the package substrate 100 in FIG. 1. Alternatively, any one of the package substrates in FIGS. 5, 7, 9 and 10 may be used in the method in place of the package substrate 100 in FIG. 1.

Figure 14:
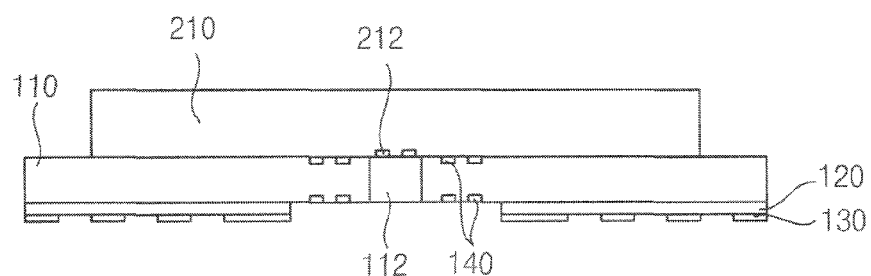

Referring to FIG. 14, the semiconductor chip 210 may be disposed on the upper surface of the package substrate 100. In an exemplary embodiment the semiconductor chip 210 may be attached to the upper surface of the package substrate 100 using, for example, an adhesive. The pads 212 of the semiconductor chip 210 may be exposed through the opening 112 of the package substrate 100.

Figure 15:
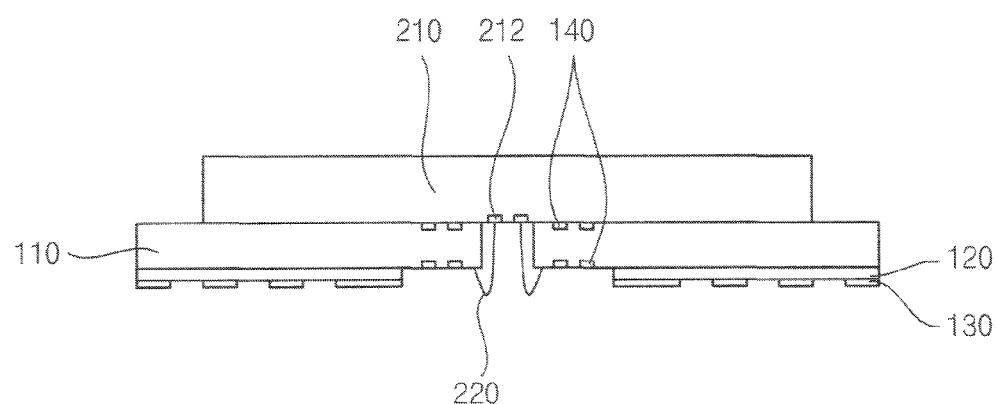

Referring to FIG. 15, the pads 212 may be electrically connected with the circuit pattern 120 using the conductive connecting members 220 such as, for example, gold wires.

Figure 16:
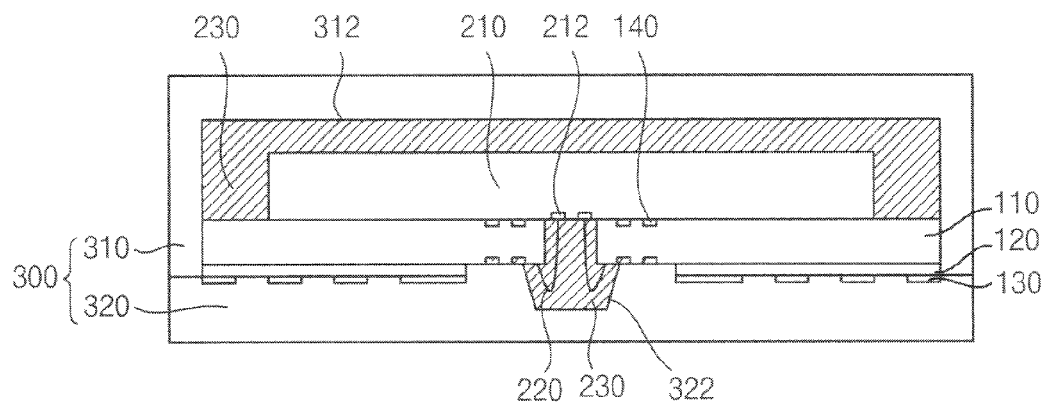

Referring to FIG. 16, the package substrate 100 having the semiconductor chip 210 may be loaded into a cavity of a mold die 300. In an exemplary embodiment, the mold die 300 may include an upper die 310 and a lower die 320. The upper die 310 may have an upper cavity 312 receiving the semiconductor chip 210 and the package substrate 100. The lower die 320 may have a lower cavity 322 receiving the conductive connecting members 220. The lower cavity 322 is aligned with and positioned under the opening 112.

The lower die 320 may contact the blocking member of the package substrate 100. Because the blocking member may have the receiving grooves 140, a contact area between the blocking member and the lower die 320 may be reduced. Thus, the lower die 320 may clamp the package substrate 100 using an increased pressure.

Figure 17:
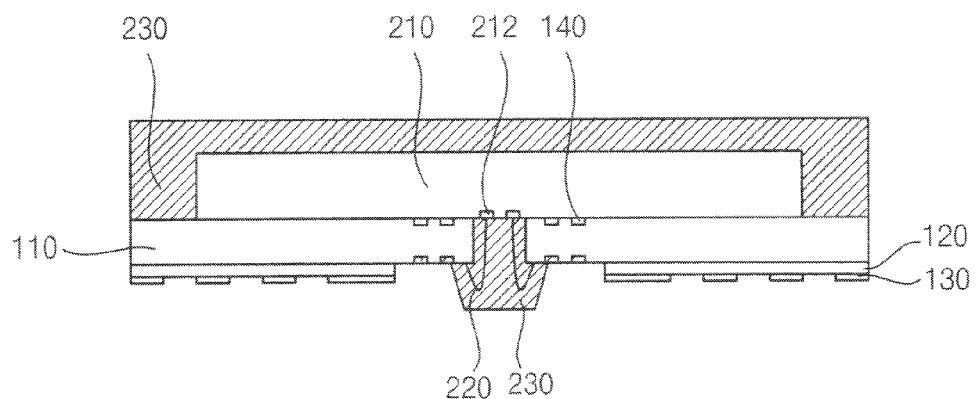

Referring to FIGS. 16 and 17, a molding material such as an EMC may be introduced into the upper cavity 312 and the lower cavity 322. The molding material may then be hardened to form the molding member 230 on the package substrate 100. The molding member 230 may cover the conductive connecting members 220 and the semiconductor chip 210.

In an exemplary embodiment, because the clamping pressure of the package substrate 100 may be high, the molding material in the lower cavity 322 may not infiltrate into the mount region.

The molding material drained between the blocking member and the lower die 320 may be received in the receiving grooves 140. Therefore, the ball lands in the mount region may not be covered with the molding material. A sufficient amount of the molding material, which may fully fill the lower cavity 322 and the receiving grooves 140, may be introduced into the lower cavity 322, so that voids may not be generated in the molding member 230.

The package substrate 100 having the molding member 230 and the semiconductor chip 210 may be unloaded from the mold die 300. The external terminals 240 such as solder balls may be mounted on the ball lands of the circuit pattern 120 to complete the semiconductor package 200 in FIG. 12.

According to an exemplary embodiment, the receiving groove may reduce an area of the blocking member, so that the mold die may apply an increased pressure to the blocking member. Thus, the blocking member may prevent the molding member from moving from the clamp region to the mount region.

A portion of the molding member, which may flow between the mold die and the blocking member, may be received in the receiving groove. As a result the molding member does not infiltrate into the mount region. An amount of the molding member, which may correspond to volumes of the receiving grooves, may be added to a total amount of the molding member, so that the voids may not be generated in the molding member.

Although exemplary embodiments of the present invention have been described herein with reference to the accompanying drawings, it is to be understood that the present invention should not be limited thereto and that various other changes and modifications may be affected therein by one of ordinary skill in the related art without departing from the scope or spirit of the invention. All such changes and modifications are intended to be included within the scope of the invention.

What is claimed is:

1. A package substrate comprising:
an insulating substrate having a mount region including external terminals mounted to the insulating substrate and a clamp region having an opening receiving a molding material therein, the clamp region disposed adjacent to the mount region in a first direction;
a circuit pattern formed on the insulating substrate; and
a blocking member blocking the molding material from moving from the clamp region to the mount region when the package substrate loaded in a mold die is pressurized to form a molding member,
wherein the blocking member is disposed on at least one side of the package substrate in the clamp region, and the blocking member receives the molding material therein.

2. The package substrate of claim 1, wherein the clamp region is located at a central portion of the insulating substrate.

3. The package substrate of claim 2, wherein the molding material passes through the opening.

4. The package substrate of claim 1, wherein the blocking member comprises at least one receiving groove extended in a second direction substantially perpendicular to the first direction.

5. The package substrate of claim 1, wherein the blocking member comprises a mesh pattern having a plurality of receiving grooves.

6. The package substrate of claim 1, wherein the blocking member is disposed on the insulating substrate.

7. The package substrate of claim 1, wherein the blocking member is disposed on portions of the circuit pattern corresponding to the clamp region of the insulating substrate.

8. The package substrate of claim 1, further comprising an insulating layer pattern formed on the insulating substrate.

9. The package substrate of claim 8, wherein the insulating layer pattern partially exposes the circuit pattern.

10. The package substrate of claim 9, wherein the blocking member is disposed on the insulating layer pattern.

11. A semiconductor package comprising:
a package substrate including an insulating substrate comprising a mount region and a clamp region, a circuit pattern formed on the insulating substrate, and a blocking member disposed on at least one side of the package substrate in the clamp region;
a semiconductor chip having pads placed on the package substrate;
conductive connecting members for electrically connecting the circuit pattern to the pads of the semiconductor chip;
a molding member disposed on the semiconductor chip and the package substrate and covering the conductive connecting members; and
external terminals mounted on the circuit pattern in the mount region,
wherein the blocking member blocks a material used to form the molding member from moving from the clamp region to the mount region when the package substrate loaded in a mold die is pressurized to form the molding member, wherein the blocking member receives the molding material therein.

12. The semiconductor package of claim 11, wherein the pads are arranged on a central portion of the semiconductor chip.

13. The semiconductor package of claim 12, wherein the package substrate has an opening formed in the clamp region to expose the pads.

14. The semiconductor package of claim 11, wherein the conductive connecting members comprise conductive wires.

15. The package substrate of claim 5, wherein the blocking member surrounds the opening.

16. The semiconductor package of claim 11, wherein the blocking member comprises at least one receiving groove.

17. The semiconductor package of claim 11, wherein the blocking member comprises a mesh pattern having a plurality of receiving grooves.

18. The semiconductor package of claim 17, wherein the clamp region comprises an opening receiving the molding material therein, and wherein the blocking member surrounds the opening.

* * * * *